(12) United States Patent
Pauchard et al.

(10) Patent No.: US 6,583,482 B2
(45) Date of Patent: Jun. 24, 2003

(54) HETERO-INTERFACE AVALANCE PHOTODETECTOR

(76) Inventors: Alexandre Pauchard, 28 Bassett St. Apt. 229, San Jose, CA (US) 95110; Yu-Hwa Lo, 10866 Cloverhurst Way, San Diego, CA (US) 92130

(*) Notice: Subject to any disclaimer, the term of this patent is extended or adjusted under 35 U.S.C. 154(b) by 0 days.

(21) Appl. No.: 09/971,316

(22) Filed: Oct. 3, 2001

(65) Prior Publication Data

US 2002/0066938 A1 Jun. 6, 2002

Related U.S. Application Data

(63) Continuation-in-part of application No. 09/730,692, filed on Dec. 6, 2000, now Pat. No. 6,384,462.

(51) Int. Cl.$^7$ ............................................. H01L 31/107
(52) U.S. Cl. ........................ 257/438; 257/461; 257/464
(58) Field of Search ............................. 257/438, 461, 257/463, 464

(56) References Cited

U.S. PATENT DOCUMENTS

| 4,761,383 A | * | 8/1988 | Matsushima et al. | ....... 257/186 |
|---|---|---|---|---|
| 5,057,891 A | * | 10/1991 | Torikai | ................. 257/186 |
| 5,132,747 A | * | 7/1992 | Matsushima et al. | ....... 257/438 |
| 5,179,431 A | * | 1/1993 | Shirai | ........................ 257/187 |
| 6,074,892 A | | 4/2000 | Schuessler et al. | ........... 438/57 |
| 6,130,441 A | | 10/2000 | Bowers et al. | ................. 257/15 |
| 6,147,391 A | | 11/2000 | Bowers et al. | ............... 257/458 |
| 6,275,321 B1 | * | 8/2001 | Greene et al. | ................ 257/18 |

* cited by examiner

*Primary Examiner*—Allan R. Wilson
(74) *Attorney, Agent, or Firm*—Kenneth M. Kaslow; Fernandez & Associates

(57) ABSTRACT

An avalanche photodetector (APD) is made from composite semiconductor materials. The absorption region of the APD is formed in a n-type InGaAs layer. The multiplication region of the APD is formed in a p-type silicon layer. The two layers are bonded together. The p-type silicon layer may be supported on an n+ type silicon substrate. A p-n junction formed at the interface between the silicon layer and the substrate. Alternatively, the n-type InGaAs layer may be supported on an InP substrate. In this case, a p-n junction is formed by making n-doped surface regions in the p-type silicon superlayer. In either case, the p-n junction is reverse biased for avalanche multiplication of charge carriers. The maximum of the electric field distribution in the APD under reverse bias operating conditions is located at p-n junction. This maximum is at a distance equal to about the thickness of the p-type silicon layer away from the absorption region. The electric field values in the absorption region depend primarily on the thickness and doping level of the p-type silicon layer. The electric field values in the absorption region are controllably set for obtaining high carrier velocities in the absorption region without causing carrier tunneling.

16 Claims, 9 Drawing Sheets

HETERO-INTERFACE AVALANCE PHOTODETECTOR

This application is a continuation-in-part of application Ser. No. 09/730,692 filed Dec. 6, 2000, now U.S. Pat. No. 6,384,462, which is incorporated by reference in its entirety herein.

FIELD OF THE INVENTION

This invention is directed toward avalanche photodetectors (APDs) useful in high-speed optical fiber applications. More particularly, the invention is related to avalanche photodetectors having high and controllable electric fields in both their absorption and multiplication regions.

BACKGROUND OF THE INVENTION

Optical fiber transmission systems are being increasingly deployed to meet the demand for high throughput telecommunication and data signal transmission. With the increasing use of optical fiber transmission systems there is a concomitant need for cost-effective high performance (i.e., low noise, high speed) components to interface between the optical fiber used for signal transmission and receiver electronics.

Interface components such as optical detectors used with the optical fiber systems are often based on the InGaAs/InP material system. InGaAs exhibits material properties such as high absorption of light in the wavelength range between 1.3 $\mu$m and 1.5 $\mu$m, high carrier mobilities and saturation velocities. These properties make InGaAs a material of choice for making efficient, high-speed photodiodes. InGaAs layers are conveniently grown on InP substrates using common epitaxial growth techniques. Most of today's APDs use InGaAs as the material for the absorption region, and use InP as the material for the multiplication region. The avalanche multiplication gain and hence the overall gain-bandwidth performance of an APD depends on the difference between the electron and hole ionization coefficients of the material used for the multiplication region. For InP material these coefficients are nearly the same. Therefore, the gain-bandwidth product of InGaAs/InP APDs is limited.

Materials such as silicon which have dissimilar electron and hole ionization coefficients are more suitable than InP for obtaining high multiplication gain. Silicon is indeed used for making low-noise and high-speed operation APDs, for example, high-performance reach-through APDs. However, silicon does not absorb light in the optical wavelength regions used for optical fiber signal transmission and cannot be used as the absorption region material for light in the wavelength range between 1.3 $\mu$m and 1.5 $\mu$m.

Recently, attempts have been made to combine the desirable optical properties of InGaAs material with the desirable low-noise and high-speed properties of silicon. Using wafer fusion techniques, composite InGaAs/silicon mesa-type APDs have been demonstrated. In these APDs an InGaAs/InP substrate wafer is fused on top of a silicon wafer. The InP substrate is etched away to leave a thin InGaAs layer on top of the silicon wafer. Portions of the silicon substrate wafer are used as the multiplication region while the InGaAs layer is used as the absorption region. Mesa type device structures are formed to limit the active area of the device. Electrical contacts are formed at the top of the InGaAs mesa and at the bottom of the silicon substrate. In the operation of an APD, a reverse bias voltage is applied across these contacts. The reverse bias voltage creates electric fields between the contacts across the multiplication and the absorption regions.

For the proper operation of these composite InGaAs/silicon APD devices, it is essential that the electric field in the InGaAs absorption regions and the silicon multiplication regions be well controlled. The two regions have contradictory electric field requirements for their proper operation. For an InGaAs/silicon APD to operate at high frequencies, the electric field in its InGaAs absorption region should be sufficiently high to impart high velocities to the photogenerated charge carriers, but should be smaller than about 150 kV/cm to suppress carrier tunneling in the InGaAs material. However, the electric field in the silicon multiplication region preferably should be above 300 kV/cm for efficient avalanche multiplication.

In an attempt to separately set the electric fields in the absorption region and the multiplication region, the prior art composite APDs use a scheme in which a thin $p^+$ doped silicon layer separates the two regions. The $p^+$ layer may be a few nanometers thick. The thin $p^+$ layer may be formed, for example, by shallow ion-implantation techniques. A portion of the reverse bias voltage applied to an APD is used in depleting the $p^+$ layer. This reduces the voltage drop across the absorption region itself and may allow the electric fields in the absorption region to be set within a different range of values than the range of electric field values in the silicon multiplication region.

However, for this scheme to work the specifications on thickness and doping concentration of the $p^+$ doped silicon layer are stringent. If either the doping concentration or the thickness of the $p^+$ layer is on the high side, a larger portion of the applied reverse bias voltage is used to deplete the $p^+$ layer. The consequently smaller voltage drop across the absorption region results in low values of electric field in the absorption region. These low values of electric field impair the bandwidth performance of the device. The reverse bias voltage required to completely deplete the $p^+$ layer may even exceed the breakdown voltage of the device if either the doping or the thickness of the $p^+$ layer is excessively on the high side. Similarly, if either the doping or the thickness of the $p^+$ layer is on the low side, a smaller portion of the applied reverse bias voltage is used to deplete the $p^+$ layer. Consequently, the $p^+$ layer may not prevent the electric fields in the InGaAs layer from attaining high values at which the undesirable carrier tunneling occurs.

Unfortunately, the thicknesses and doping concentrations of thin implanted $p^+$ layers are parameters that are susceptible to fabrication process variations. Conventional shallow ion-implantation techniques are not yet sufficiently developed to reliably or reproducibly control these parameters.

It would therefore be desirable to have composite APD structures in which the electric fields do not depend on sensitive process parameters and which can be fabricated with a wider processing latitude.

Another disadvantage of prior-art composite APD structures is that the electric field values in the absorption regions also are sensitive to changes in the applied reverse bias voltage. In APDs with $p^+$ doped layers, the electric fields are at a maximum at the edges of the absorption regions. With increasing reverse bias voltages the electric fields increasingly penetrate into the multiplication regions in a direction away from the absorption layers. This feature of the APD structures with $p^+$ doped layers is not conducive to controlling electric fields at high values within the absorption regions. Slight changes in the reverse bias voltages may cause large changes in the electric fields in the absorption regions. It is therefore further desirable to have composite APD structures in which the electric fields in the absorption regions change gradually in response to changes in the applied reverse bias voltages.

SUMMARY OF THE INVENTION

The invention is directed toward composite APD devices in which the multiplication regions and absorption regions are made of different semiconductor materials. The APD device structures of the present invention are designed to achieve control of electric fields in the absorption regions and the multiplication regions without use of intervening $p^+$ doped layers. The composite APD devices may be fabricated using wafer fusion, bonding or any other suitable techniques for making composite structures.

Control over the electrical field values in an APD device is obtained by placing the p-n junction diode that is used to separate charge carriers in the APD device at some suitable distance away from the absorption region in the device structure. The electrical fields values in the absorption region and the multiplication region may be controllably chosen for high gain-bandwidth device performance.

In one aspect the present invention is directed toward APD device structures which are formed on a compound semiconductor substrate wafer, for example, an InP wafer. An epitaxial absorption layer (e.g., InGaAs) is grown on the InP wafer substrate. Portions of this layer serve as the absorption regions of the APD devices. Using wafer fusion, bonding, etching, thinning and other suitable techniques a thinned silicon layer is disposed on the top of the epitaxial absorption layer. The thickness of this thinned silicon layer may be controlled, for example, using iterative measurement and etching techniques. Portions of this silicon layer serve to form the multiplication regions of the devices. The silicon layer may, for example, be $p^-$ doped. By implanting or diffusing, for example, n-type dopants, through the top surface of the silicon layer, n or $n^+$ doped surface regions are formed in the silicon layer. These n-doped surface regions and the underlying $p^-$ doped silicon layer make up p-n junction diodes which serve to separate charge carriers during the operation of the APD devices. Conventional metallization schemes may be used to make metal contacts on the top surface of the silicon layer and to the backside of the InP substrate.

The thinned silicon layer/InGaAs composite supported on the InP substrate may be processed further to form APD devices and circuits. For example, suitable ion-implanted guard ring structures may be formed to define active device areas and to form planar APD devices. Additionally, electronic components, such as JFETs or HBTs may be formed on the InGaAs layer and the InP substrate adjoining individual planar APDs devices to form monolithic transimpedance photoreceivers. For some high frequency applications for which APD active areas must be well defined, mesa-type devices may be formed using conventional patterning and etching techniques to etch through the silicon and InGaAs layers.

In another aspect the present invention is directed toward APD device structures formed on a silicon substrate wafer. These device structures may, for example, use mesas to define the active device areas. A $p^-$ doped epitaxial silicon layer is formed on an $n^+$ doped substrate wafer. The $p^-$ doped silicon layer serves as the multiplication region of the APD devices. Using techniques such as wafer bonding and substrate etching, an $n^-$ doped InGaAs absorption layer is disposed on top of the $p^-$ doped epitaxial silicon layer. Contact to the InGaAs layer may be made using conventional multi-layer structures such as a $p^+$ GaInAsP contact layer grown on suitable p-type InP and graded InP buffer layers which are first grown on the InGaAs layer. Alternatively, contact to the InGaAs layer may be made through a $p^+$ InGaAs layer grown directly on the InGaAs layer. Common patterning and etching techniques may be used to etch device mesas. These mesas may have any diameter suitable for optical coupling to optical fibers. Metallic layers disposed on the back side of the silicon substrate wafer and on the top of the InGaAs contact layer form terminal contacts for applying signals and bias voltages to the APD device.

The APD device structures of the present invention whether of the type formed on InP substrates or of the type formed on silicon substrates do not depend on the use of a $p^+$ doped layer to control the electrical fields in the absorption and the multiplication regions of the devices. In APD devices of the present invention, the electric field maximum under reverse bias operation conditions is located at the p-n junction in the multiplication region a distance away from the absorption region. In the case of devices formed on a silicon substrate the p-n junction is at the interface between the $p^-$ epitaxial silicon layer and the $n^+$ silicon substrate. In the case of devices formed on an InP substrate the p-n junction is at the interface between the thinned $p^-$ silicon layer and the n or $n^+$ doped surface regions. As the reverse bias voltage applied to an APD increases the electric fields in the device increase and move toward the InGaAs absorption layer. Since the diode p-n junctions are located at a distance, (for example, equal to the thickness of the silicon epilayer or the thickness of a thinned silicon layer) away from the absorption InGaAs layer, the electric field increases in absorption region gradually and controllably. The electric field values in the absorption region depend primarily on the thickness and doping concentration of the silicon layer (epitaxial or thinned). These parameters are well controlled, for example, in conventional epitaxial silicon growth processes.

By suitable choice of dopant concentration and silicon layer thickness and the electric field in the absorption layers may be set at a high value which corresponds to high carrier velocities in the absorption region, but yet which is below electric field values which cause carrier tunneling in InGaAs. The APDs of the present invention can, therefore, operate with a higher response speed and a larger bandwidth compared to prior art devices.

Further features and advantages of the present invention will be more apparent from the accompanying drawings and the following detailed description.

DETAILED DESCRIPTION OF CERTAIN ILLUSTRATED EMBODIMENTS

The present invention provides APD device structures in which the electric fields do not depend on parameters that are sensitive to fabrication process variations. The APD device structures are designed such that the electrical fields in the absorption and the multiplication regions are well controlled. Control over electrical field values is obtained by placing the p-n junction that is used to separate charge carriers in the APD device at some suitable distance away from the absorption region of the device. This distance causes the electric field in the absorption region to change gradually in response to changes in applied reverse bias voltage. The electrical fields values in the absorption region and the multiplication region may be suitably chosen for high gain-bandwidth device performance.

For continuity in the description of the invention herein, portions of the description below summarize or substantially reproduce portions of the description in co-pending U.S. patent application Ser. No. 09/730,692 incorporated by reference herein.

In one aspect the present invention is directed toward APD device structures which are formed on a compound semiconductor substrate wafer, for example, an InP wafer. An epitaxial absorption layer (e.g., InGaAs) is grown on an InP wafer substrate. Portions of this epitaxial layer serve as the absorption regions of the APD devices. Using wafer fusion, bonding, etching, chemical-mechanical polishing or other suitable techniques, a thinned silicon layer is disposed on the top of the epitaxial absorption layer. The thickness of this thinned silicon layer may, for example, be controlled by iterative measurement and etching. Portions of the thinned silicon layer serve to form the multiplication regions of the devices.

Figure 1:
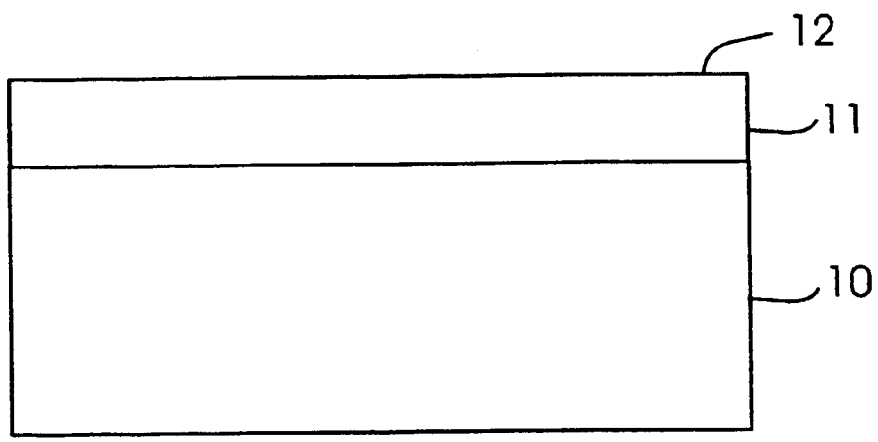
FIG. 1 shows schematically an InGaAs/InP epitaxial wafer.

An embodiment of the invention is directed toward a planar photodetector structure 200 (FIG. 4) that may be fabricated, for example, by a wafer bonding technique with a small number of processing steps. With reference to FIGS. 1–4, 8 and 9, absorption layer 11 made of, for example, unintentionally doped n-type InGaAs is grown on substrate wafer 10. Substrate 10 may, for example, be a heavily doped p-type InP wafer with a dopant concentration greater than about $10^{18}$ atoms/cm$^{-3}$ (FIG. 1). Absorption layer 11 may be about 1 μm thick and have a doping concentration of the order of $10^{15}$ atoms/cm$^{-3}$.

Figure 2:
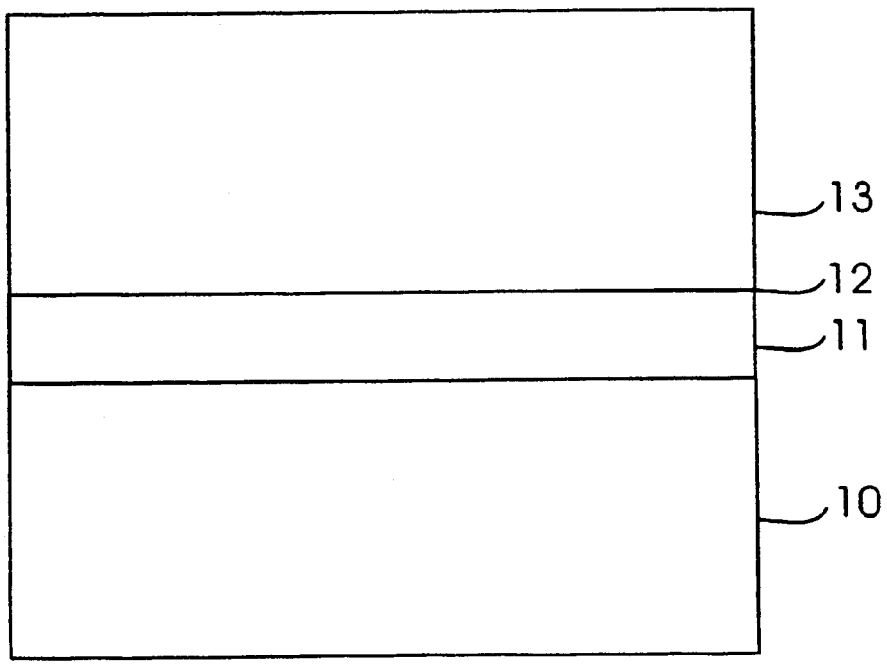
FIG. 2 shows schematically a silicon wafer bonded to the epitaxial wafer.
Figure 3:
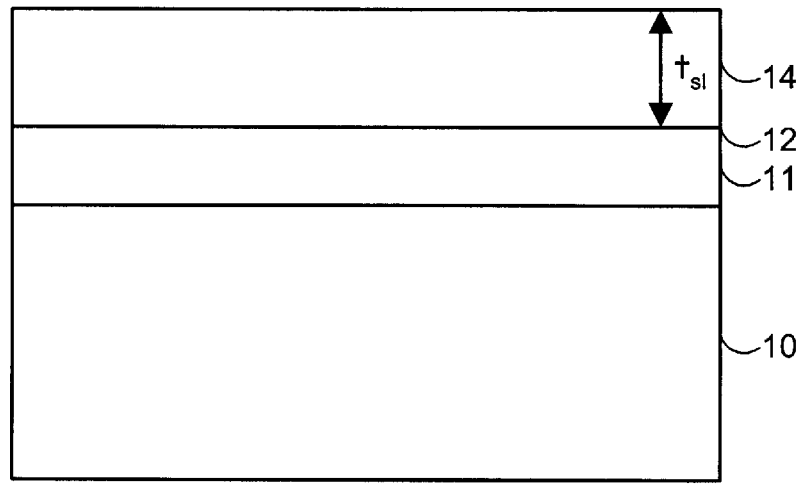
FIG. 3 shows schematically the thinned silicon/epitaxial wafer structure of FIG. 2.

As shown in FIG. 2, a silicon wafer 13 is bonded to top surface 12 of the absorption layer 11. Silicon wafer 13 may, for example, be a p-type wafer with a dopant concentration of the order of about $10^{16}$–$10^{17}$ atoms/cm$^{-3}$. Wafer 13 may optionally be thinned prior to wafer bonding. Following wafer bonding, the silicon wafer 13 is thinned, for example, by etching, to form a layer 14 having a thickness $t_{si}$ (FIG. 3). The value of thickness $t_{si}$ is chosen based on considerations of device physics and may, for example, have a suitable value ranging from about one to several microns.

One or more conventional processing methods may be used to controllably thin silicon wafer 13 to desired values of $t_{si}$. These processing methods may involve iterative thickness measurements and thinning process steps such as grinding, lapping, chemical or plasma etching, and chemical-mechanical polishing. In one thinning method for forming layer 14, a bulk silicon wafer is first ground or lapped to a coarse layer having a thickness a few times larger than the desired thickness $t_{si}$ of layer 14. By conventional patterning and selective etching techniques windows are etched in the coarse silicon layer to expose the underlying InP substrate. Measurement of the coarse silicon layer thickness may be made running a mechanical stylus across the exposed windows. Other common techniques for measuring the thickness of semiconductor layers such as optical FTIR spectroscopy may additionally or alternatively be used to measure the thickness of the coarse silicon layer. By iterative thickness measurement and etching the coarse silicon layer may be thinned to form layer 14 having the desired thickness $t_{si}$.

In a variation of the thinning method described above, nitrides or oxides having a thickness corresponding to $t_{si}$ may be deposited in the exposed windows. These nitrides or oxides may be used as chemical-mechanical etch stops to form layer 14 with the desired thickness by chemical-mechanical polishing of the coarse silicon layer.

Other methods for forming layer 14 having the desired thickness $t_{si}$ may rely on the use of silicon wafers with built-in etchstops. Silicon wafer 13 may, for example, be a silicon-on-insulator (SOI) wafer with a superficial silicon layer having a thickness of about $t_{si}$ disposed on top of an oxide insulator layer. SOI wafer 13 may be lapped or etched prior to selectively etching the insulator layer, leaving behind a thin silicon layer 14 having a thickness of about $t_{si}$ disposed on top of layer 11.

A p-n junction diode for carrier separation in the multiplication region of the APD device is formed in a top surface region of layer 14. The p-n junction may be formed, for example, by forming an n$^+$-type layer 15 by ion implantation or diffusion of suitable dopants though portions of the top surface of layer 14. The interface between layer 15 and the underlying p-type silicon layer 14 forms the p-n junction. This p-n junction is approximately a distance equal to $t_{si}$ above absorption layer 11.

Figure 4:
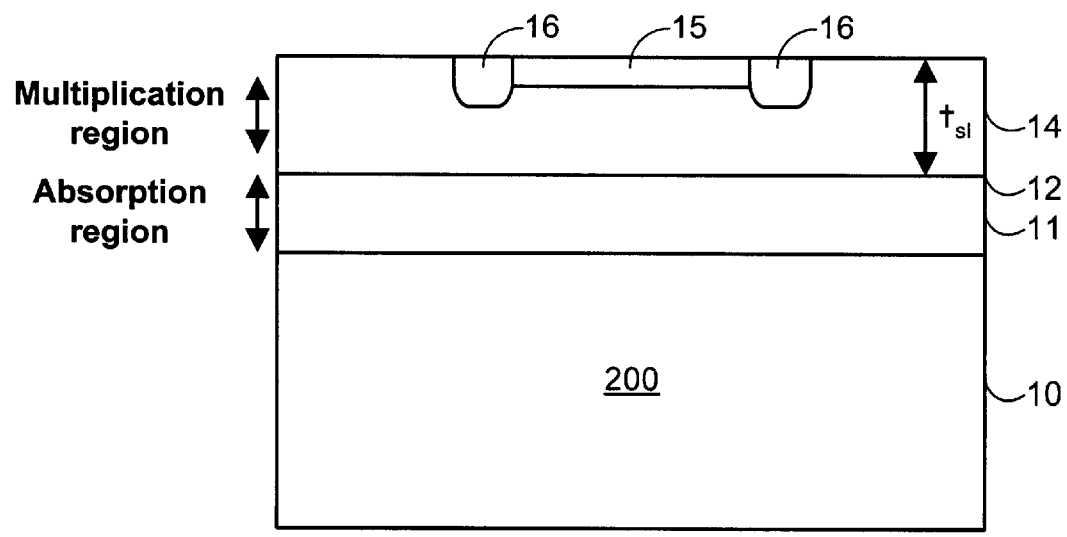
FIG. 4 shows schematically the thinned silicon/epitaxial wafer of FIG. 3 with a contact layer and a guard-ring in accordance with the present invention.
Figure 8:
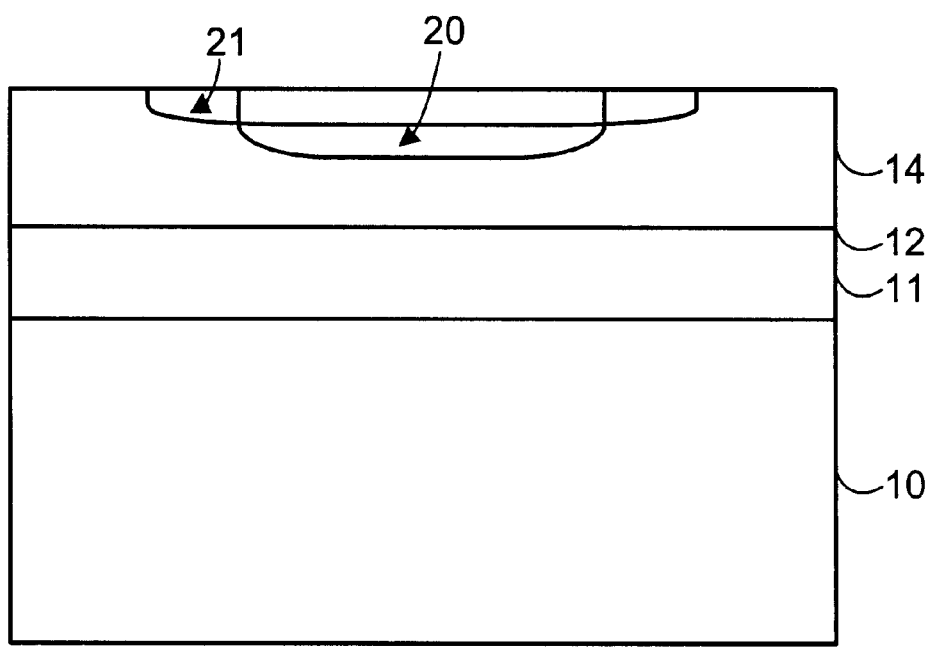
FIG. 8 shows one embodiment of the guard-ring in accordance with the present invention.
Figure 9:
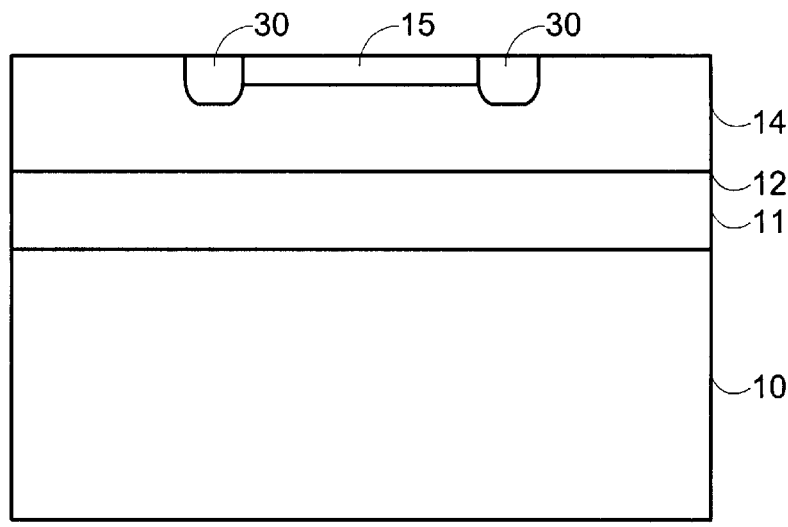
FIG. 9 shows an alternative embodiment of the guard-ring in accordance with the present invention.

Premature edge breakdown at low reverse bias in the APD devices may be suppressed or prevented by forming suitable guard rings around the edges of n$^+$-type layer 15. Conventional processing techniques such as ion-implantation may be used to form the guard rings. FIGS. 4, 8, and 9, show, for example, different types of guard rings 16, 20–21, and 30, respectively, which may be used to suppress or prevent premature edge breakdown.

Further, conventional metallization processes, for example, metal deposition on n$^+$-type layer 15, may be used to form terminal contacts (not shown) for applying bias voltages and signals to the APD devices.

Figure 7:
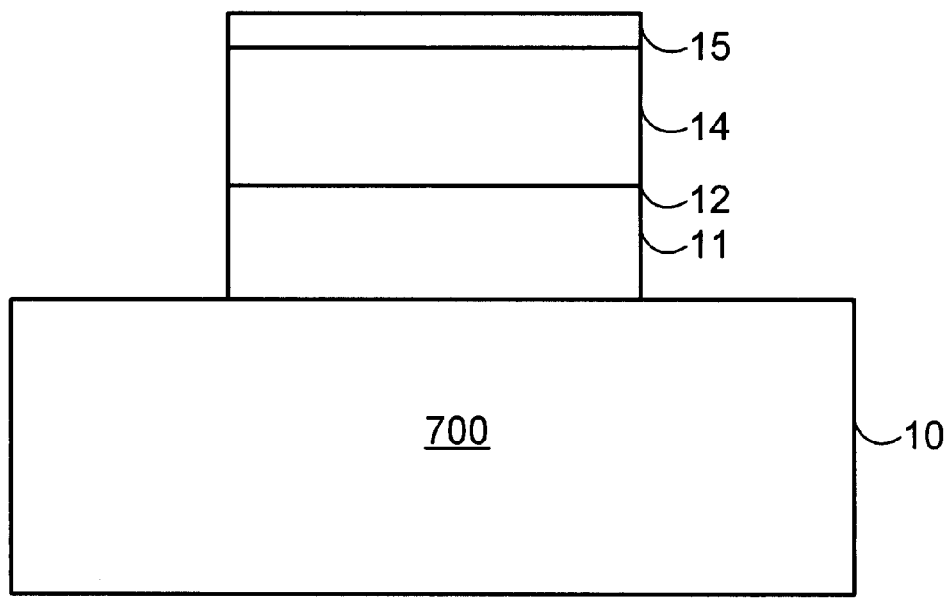
FIG. 7 shows schematically a mesa structure in accordance with the present invention.
Figure 10:
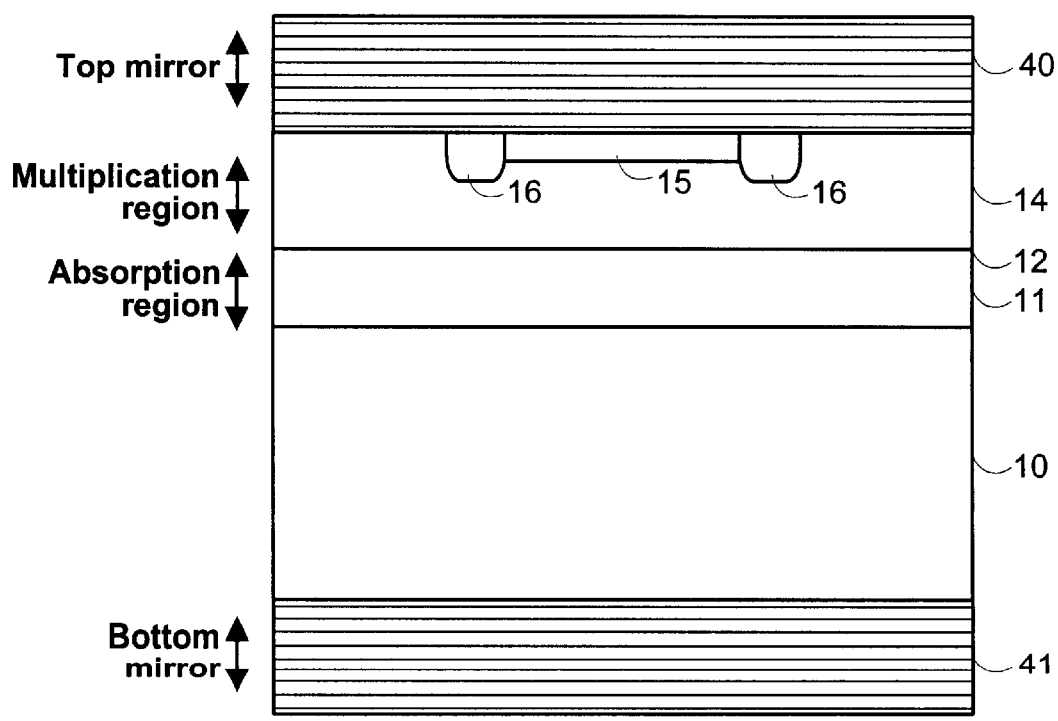
FIG. 10 shows schematically the structure of FIG. 4 with additional top and bottom mirrors in accordance with the present invention.
Figure 11:
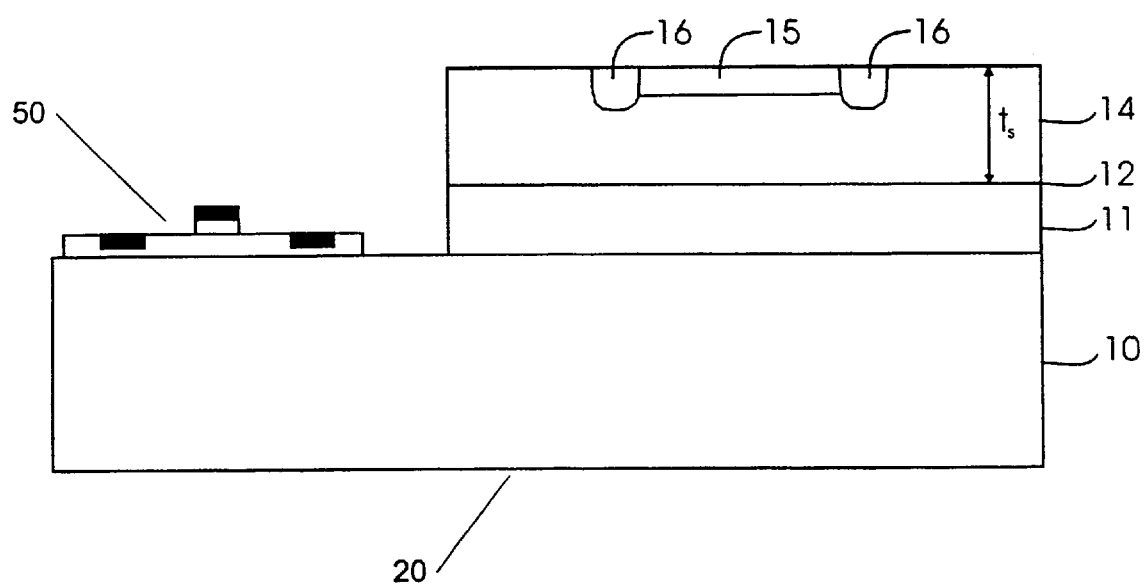
FIG. 11 shows schematically the structure of FIG. 4 with an additional junction field effect transistor to form a monolithic optical receiver in accordance with the present invention.

The planar photodetector structure embodiment described above may be extended or adapted for use in more complex devices or integrated device circuitry. For example, FIG. 11 shows a monolithically integrated transimpedance photoreceiver, combining the APD of FIG. 4 with a junction field-effect transistor (JFET) 50. The exemplary JFET may be formed in the same InGaAs layer 11 which serves as absorption layer 11 of APD structure 200. Further, for example, FIG. 10 shows a resonant-cavity APD based on the APD of FIG. 4 that advantageously increases the gain-quantum efficiency. A top mirror 40 and a bottom mirror 41 are formed on respective top and bottom surfaces of APD 200. Unabsorbed fractions of light incident on absorption layer 11 are reflected through layer 11 repeatedly by mirrors 40 and 41. The repeated traversals of light though layer 11 increases the overall light absorption and hence the responsivity of the APD. Further, for example, for applications which require devices operating at very high frequency the active device areas are preferably well defined. Mesa-type devices with well defined active areas may be formed using the structure shown in FIG. 4. FIG. 7 shows, for example, device mesa 700 formed on InP substrate 10. Device mesa 700 may be fabricated by etching silicon layers 14 and 15, and InGaAs layer 11 down to substrate 10. Conventional semiconductor patterning and etching processes may be used to form mesa 700.

Figure 5:
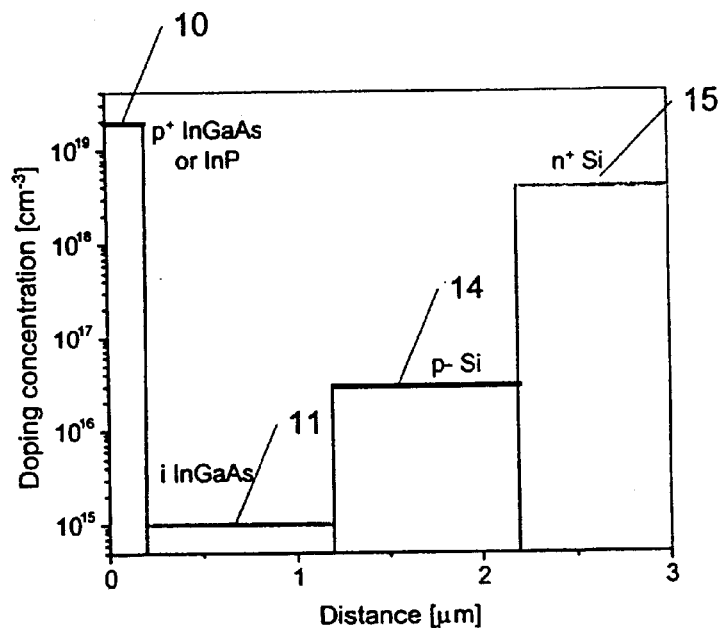
FIG. 5 shows the doping concentration profile across the structure of FIG. 4.
Figure 6:
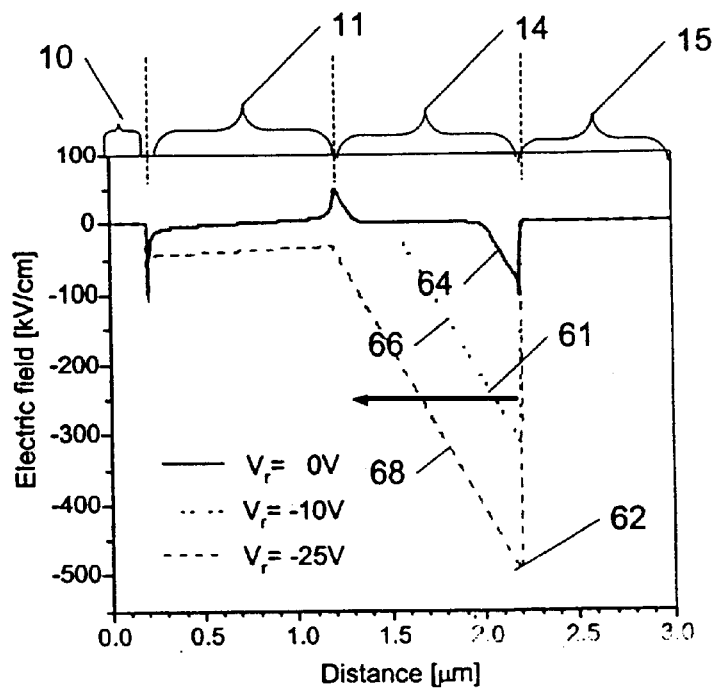
FIG. 6 shows the calculated electric field distributions in the structure of FIG. 4 for reverse bias voltages of 0 Volts, −10 Volts and −25 Volts.

The APD devices made using structures such as structure 200 shown in FIG. 4 do not rely on a $p^+$ layer to help control the electric fields in absorption layer 11 or multiplication layer 14. The electric fields in the APD devices made using structure 200 depend on the thickness and the doping levels in the various layers. With suitably chosen layer parameters the electric field in absorption layer 11 is primarily determined by the thickness and doping concentration of layer 14. FIG. 5 illustrates an exemplary doping concentration profile across the APD structure 200 (FIG. 4). FIG. 6 illustrates calculated electric field distributions 64, 66, and 68 across a structure 200 having the thickness and doping parameters shown in FIG. 5. Electric field distribution 64, 66, and 68 are calculated for applied reverse bias voltages $V_r$ of 0 volts, –10 volts, and –25 volts, respectively. The electric field maximum 62 for all three distributions is located at the interface between $n^+$-type layer 15 and p-type silicon layer 14. As shown in FIG. 6, an increase in reverse bias voltage $V_r$ increases the electric field in the multiplication region (layer 14) and simultaneously moves the electric field toward the absorption region (layer 11), as indicated by arrow 61. When the applied reverse bias $V_r$ exceeds a certain value depending on the specific thickness and doping concentrations of layers 11 and 14, the electric field penetrates InGaAs absorption layer 11. For the example illustrated in FIG. 6, this certain value is between –10 volts and –25 volts. Any further increase in the applied reverse bias voltage increases the electric field in both the absorption region and the multiplication region. For example, at a reverse bias voltage of –25 volts, the electrical field in absorption layer 11 is approximately 50 kV/cm.

Since the electric field maximum is located a distance away from absorption layer 11, the electric field in absorption layer 11 rises gradually with increasing reverse bias voltages. This feature of the APD devices of the present invention permits good control over the value of the electric field in absorption layer 11. The electric field within InGaAs absorption layer 11 must preferably be high enough for the charge carriers to reach the saturation velocity, but must be kept below about 150 kV/cm to avoid a high leakage current due to carrier tunneling in the absorption layer 11. A suitable value for the electric field may be, for example, 50 kV/cm to about 100 kV/cm.

By virtue of the inventive design of the device structures, the electric field strength in the absorption region is dependent primarily on only two parameters: the thickness, and the doping concentration of multiplication layer 14. The dependence is not critical as the electric field strength in the absorption region varies gradually with changes in either of the two parameters. Moreover, both parameters are well controlled in conventional semiconductor fabrication processes including epitaxial growth processes, such as chemical vapor deposition (CVD) and molecular beam epitaxy (MBE). As described below, the thickness and doping concentration of multiplication layer 14 also may be optimized to achieve a high electric field within the silicon layer 14 for optimal avalanche multiplication.

The design of APD structure 200 may be optimized to yield a high electric field value in silicon layer 14 for large avalanche multiplication gain. As mentioned earlier with reference to FIG. 6, electric field maximum 62 in layer 14 occurs at the p-n junction interface between layer 14 and layer 15. The strength of this maximum is largely a function of the p-n junction diode parameters such as the dopant concentrations and gradients across the p-n junction. These parameters may have values designed by choice for obtaining high electric field values in silicon layer 14.

Figure 12:
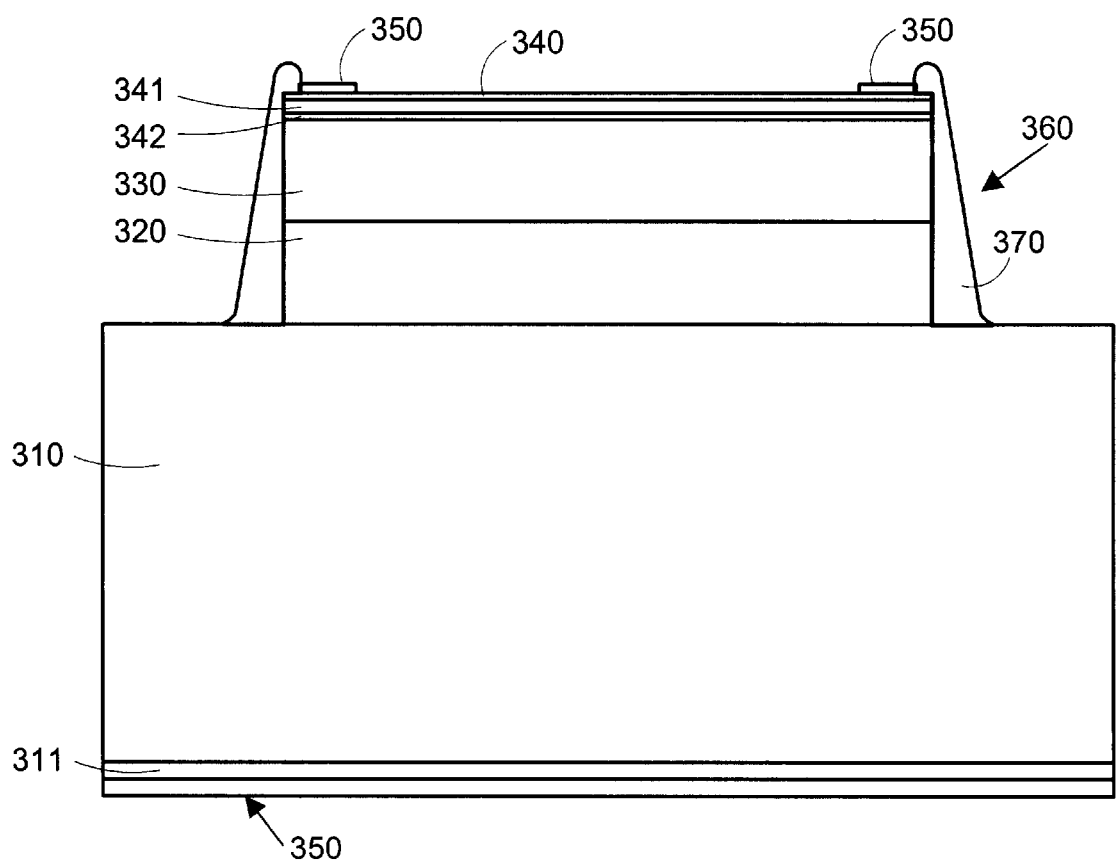
FIG. 12 illustrates in cross section a mesa-type APD structure formed on a silicon substrate in accordance with the present invention.

In another aspect the present invention is directed toward APD structures formed on a silicon substrate wafer. An embodiment is directed toward mesa-type APD structures in which compound semiconductor (e.g., InGaAs) mesas are formed on a silicon substrate wafer. FIG. 12 illustrates in cross section a mesa-type APD structure 300 formed on a silicon substrate wafer 310. Silicon substrate 310 may be an $n^+$ doped wafer. An optional $n^+$ contact layer 311 may be formed on the backside of the substrate 310 by conventional techniques, for example, by ion-implantation. Epitaxial silicon layer 320 is grown on substrate 300. Layer 320 may be doped with a suitable p-type dopant such as boron. Using techniques such as wafer bonding and substrate etching, a n-doped InGaAs absorption layer 330 is disposed on top of layer 320. Contact to the layer 330 may be made using conventional multi-layer structures such as a $p^+$ GaInAsP contact layer 340 grown on suitable p-type InP and graded InP buffer layers 341 and 342, respectively. Mesa 360 is formed by conventional patterning and etching techniques. Metallic layers 350 which may be patterned provide terminal contacts for applying signals and bias voltages to APD 300. The sidewalls of mesa 360 may optionally be covered by protective or passivating layer 370. Protective layer 370 may be formed of any suitable materials such as oxides, nitrides, or resists.

Figure 13:
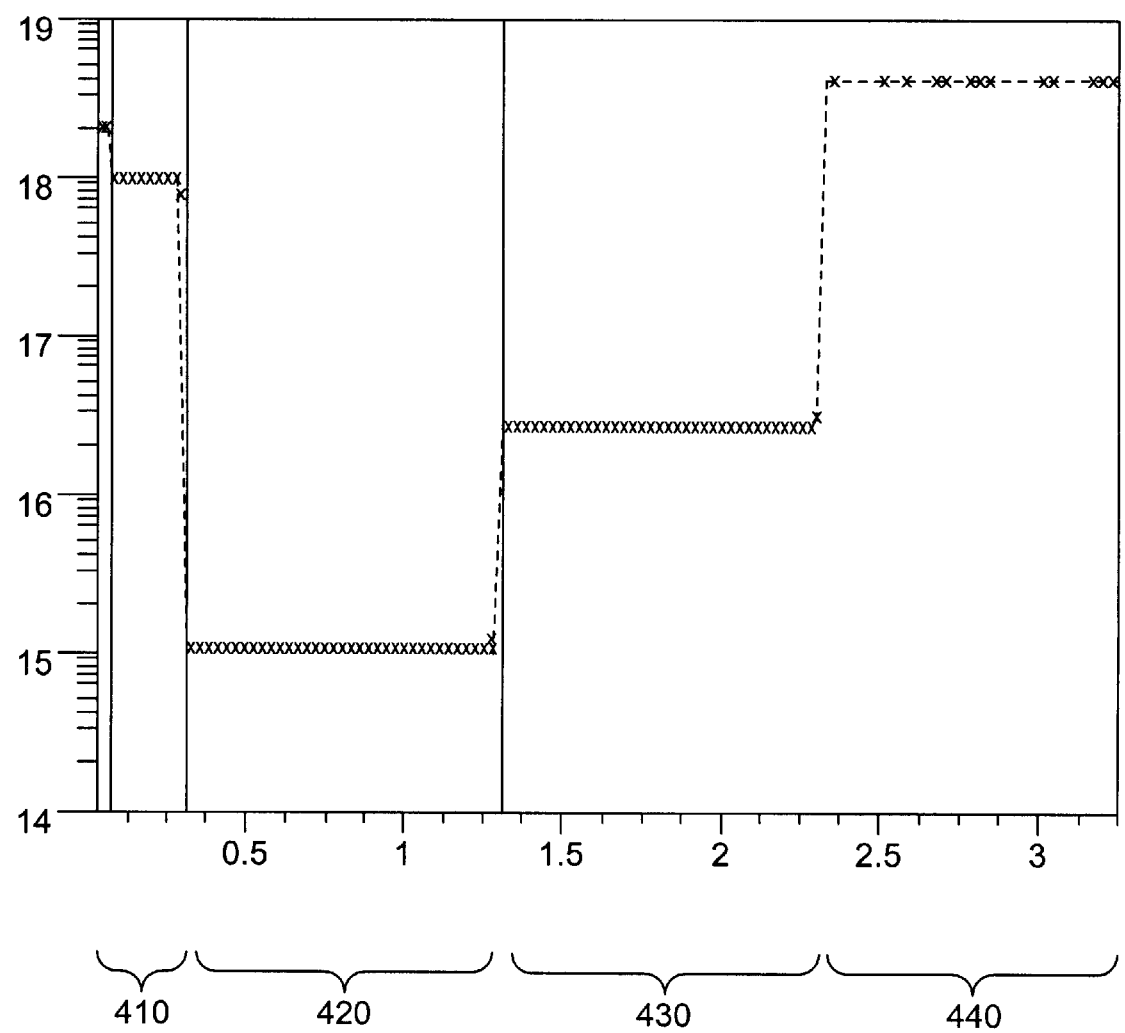
FIG. 13 illustrates the doping profile across another mesa-type APD structure formed on a silicon substrate in accordance with the present invention.

Instead of $p^+$ GaInAsP contact layer 340 shown on FIG. 12, contact to absorption layer 330 also may be made using, for example, a $p^+$-doped InGaAs layer (not shown) grown directly on layer 330. FIG. 13, shows, for example, the doping profile across a mesa APD structure in which electrical contact to InGaAs absorption layer 420 is made through $p^+$ InGaAs contact layer 410 (instead of, e.g., $p^+$ GaInAsP contact layer 340, FIG. 12). InGaAs layer 420 is adjacent to $p^-$ doped epitaxial silicon layer 30 which is formed on $n^+$ substrate 440.

Figure 14:
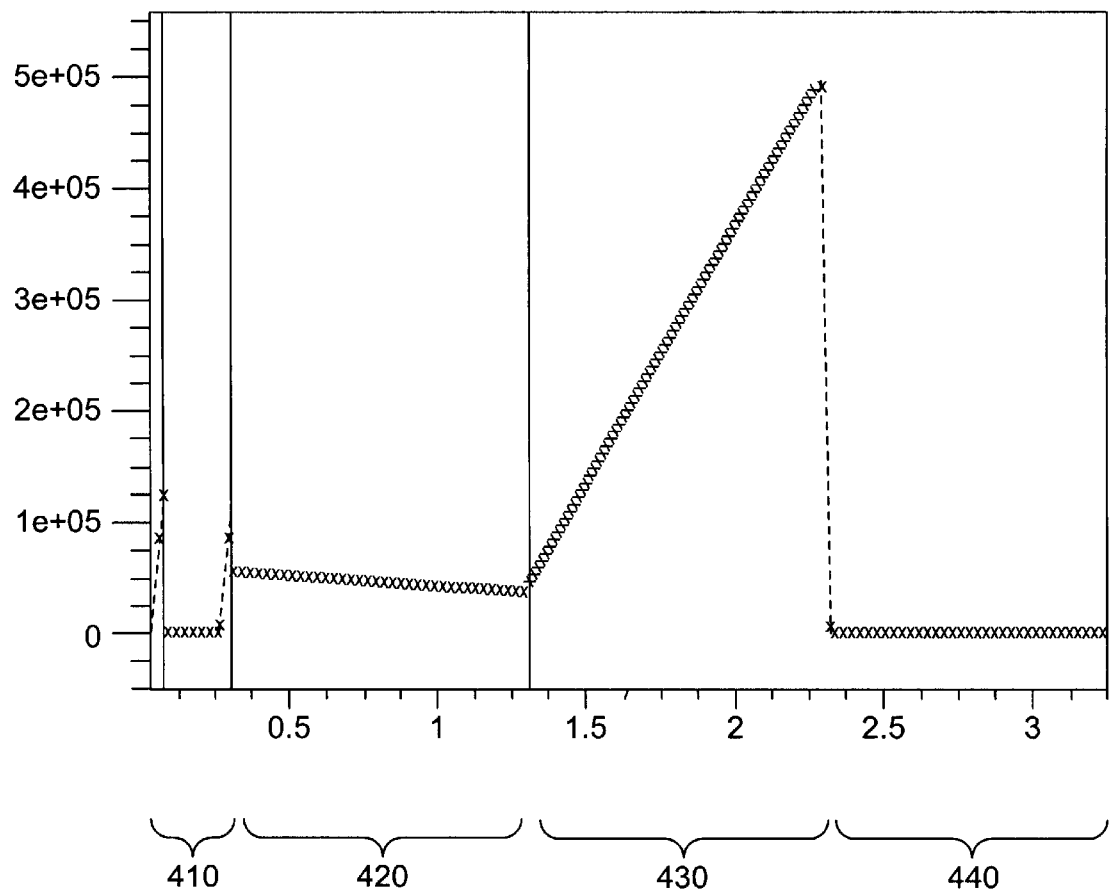
FIG. 14 illustrates the calculated electric field across the APD structure of FIG. 13.

As mentioned earlier the electric field distribution across an APD device may be calculated using device parameters such as the doping profile and layer thicknesses. FIG. 14 shows, for example, calculated electric field distribution 500 across the APD structure of FIG. 13 at an applied reverse bias voltage of −33 volts. Electric field distribution 500 has a maximum 510 at about the interface between layer 430 and substrate 440. The electric field monotonically deceases from maximum 510 throughout layer 430 toward the absorption layer 420. The electric field in absorption layer 420 itself is about 50 kV/cm. The doping profiles and the electrical field distributions across the mesa-type APDs formed on silicon substrates as shown, for example, in FIGS. 13 and 14, are similar to the doping profiles and electrical field distributions of the planar heterostructure APDs described earlier (with reference to FIGS. 5 and 6, respectively).

Just like the APDs formed on InP substrates described earlier, the mesa-type APDs formed on silicon substrates do not rely on a thin $p^+$-doped layer to help control the electrical field values in the absorption regions and the multiplication regions. As described earlier in the context of APDs formed on InP substrates (with reference to FIGS. 5 and 6), the electric field maxima in the APD devices formed on silicon substrates are located in the multiplication region a distance away from the absorption region. For the APDs formed on silicon substrates these maxima are located at about the interface between the $n^+$ substrate and the $p^-$-doped epitaxial silicon layer, for example, at the interface between layers 430 and 440. Increasing the reverse bias voltage moves the electric field distributions towards absorption layer 420. The electric field distribution penetrates into the InGaAs absorption region when the reverse bias voltage exceeds a certain value. As the reverse bias voltage $V_r$ is further increased, the electric field in the absorption region increases gradually.

The electric field value in the absorption region 420 depends primarily on the thickness and doping concentration of epitaxial layer 430. These parameters are well controlled in the conventional epitaxial growth techniques that may be used to fabricate the APDs. By suitable choice of epitaxial layer thickness and dopant concentration the electric field in the absorption layer 420 may be set at a suitable value that is high enough to impart high velocities to photogenerated charge carriers, but yet is below the approximately 150 kV/cm value that causes tunneling.

The suitable choice of silicon epitaxial layer thickness and dopant concentration is one of the considerations in the design of the mesa-type APD structures (e.g., structure 300, FIG. 12) of the present invention. Other design considerations may include optimization of the III–V compound portions and the silicon portions of the APD structures. The optimization of the III–V portions may involve a trade-off between quantum efficiency (or responsivity) and detector response speed. Conventional device simulation software tools (e.g., ATLAS sold by Silvaco International, Santa Clara, Calif. 95054) commonly used in the semiconductor industry may be used to design the APD structures.

An exemplary set of design values of the semiconductor layers of a mesa-type APD structure formed on silicon substrates (e.g., structure 300 FIG. 12) is:

$p^+$-type InGaAsP contact layer 340 (50 nm thick, zinc doped to greater than about $2 \times 10^{18}$ atoms/cm$^{-3}$, with a cutoff wavelength, $\lambda^{cutoff}=1.15$ μm;

p-type InP layer 341 (about 150 nm thick, zinc doped to about $1 \times 10^{18}$ atoms/cm$^{-3}$);

p-type InP grading layer 342 (about 50 nm thick, graded zinc doping level from 0 to about $10^{18}$ atoms/cm$^{-3}$);

n-type InGaAs absorption layer 330 (about 1000 nm thick, unintentional doping level less than $1 \times 10^{15}$ atoms/cm$^{-3}$);

epitaxial silicon layer 320 (about 1 um thick, boron doped to about $3 \times 10^{16}$ atoms/cm$^{-3}$;

$n^+$ type silicon substrate 300 (resistivity of about 10–20 mΩ-cm); and backside $n^+$ implant layer 310 (40 keV implant, dose $10^{15}$ atoms/cm$^{-2}$).

With these design values, the p-n junction formed by epitaxial silicon layer 320 and substrate 300 has a built-in potential $V_{bi}$ of about 0.8 volts. The depletion width W of the unbiased p-n junction is about a tenth of a micron (0.075 um, for substrate 300 doping level of about $3 \times 10^{18}$ atoms/cm$^{-3}$). A dopant concentration of about $3 \times 10^{16}$ $cm^{-3}$ in layer 320 corresponds to a p-n junction breakdown voltage $V_{br}$ of about −34 V. This doping level is low enough to minimize a tunneling current component that may appear at the silicon p-n junction (i.e., between layer 320 and substrate 300) at higher doping concentrations. Also, the doping level is low enough to keep APD excess noise levels low. The resistivity value (i.e., doping concentration) of the substrate 300 is not critical as long as it is substantially larger than that of the epitaxial layer 320.

For a set value of the doping concentration of layer 320, the thickness layer 320 determines the electric field in the InGaAs absorption region. A device simulation (using ATLAS) performed at a reverse voltage of $V_r=−33$ V shows that the electric field in the absorption layer 330 has a value of about of $0.5 \times 10^5$ V/cm, and that the electric field has a maximum value of about of $5 \times 10^5$ V/cm at the p-n silicon junction (FIG. 14). Reducing the thickness layer 320 increases the electric field in the absorption layer 330. For example, reducing the thickness of layer 320 to 0.9 μm increases the electric field value to about $1 \times 10^5$ V/cm. However, since the hole drift saturation velocities in the InGaAs layer are relatively constant for electric field values between $0.2 \times 10^5$ V/cm and $1 \times 10^5$ V/cm, a thickness of 1 μm (corresponding to an electric field of $0.5 \times 10^5$ V/cm) is a suitable design choice for the thickness of layer 320. Reducing the thickness of layer 320 substantially below 0.9 μm will increase the electric field in absorption layer 320 to values above $1 \times 10^5$ V/cm. As mentioned earlier, undesirable carrier tunneling in InGaAs is caused by such high values of electric field.

It will be understood that the foregoing is only illustrative of the principles of the invention and that various modifications can be made by those skilled in the art without departing from the scope and the spirit of the invention. For example, although the composite APDs were described as being fabricated using InP, InGaAs and Si materials, similar devices also can be fabricated in accordance with the invention using other optically active semiconductor material suitable for making absorption layers. Optically active semiconductor materials may include III–V compound materials such as GaAs, GaP, GaN and the like, and II–VI compound materials such as ZnSe, CdTe and the like. These other semiconductors may be appropriate for making absorption layers depending on the desired device application and wavelength range of operation. Similarly, materials other than silicon such as other elemental or compound semiconductors with suitable electronic properties may be used to make the multiplication regions of the APD devices in accordance with the invention.

What is claimed is:

1. A photodetector comprising:
    an absorption region made from a first semiconductor material, said absorption region configured to photogenerate charge carriers in response to incident light;
    a multiplication region made from a second semiconductor material configured to receive at least a fraction of said photogenerated charge carriers, and comprising a p-n junction to substantially multiply the number of charge carriers by avalanche multiplication; and contacts for applying a reverse bias voltage across said photodetector, wherein said semiconductor materials have lattice constants which differ from each other by more than 1%, and said p-n junction is at a distance of more than about two tenths of a micron from said absorption region.

2. A photodetector comprising:

an absorption region made from a first semiconductor material, said absorption region configured to photogenerate charge carriers in response to incident light;

a multiplication region made from a second semiconductor material configured to receive at least a fraction of said photogenerated charge carriers, and comprising a p-n junction to substantially multiply the number of charge carriers by avalanche multiplication, said p-n junction having an unbiased depletion width; and contacts for applying a reverse bias voltage across said photodetector, wherein said regions are in physical proximity, said semiconductor materials have lattice constants which differ from each other by more than 1%, and wherein said p-n junction is at a distance greater than said unbiased depletion width away from said absorption region.

3. The photodetector of claim 2 wherein said first semiconductor material is a compound semiconductor layer disposed on a substrate wafer, and wherein said second semiconductor material is a Group IV semiconductor layer disposed on top of said compound semiconductor layer.

4. The photodetector of claim 3 wherein said first semiconductor material is an InGaAs layer epitaxially grown on an InP substrate and said second semiconductor material is a thin silicon layer.

5. A monolithic circuit comprising:

the photodetector of claim 3; and components at least partially formed in said compound semiconductor layer adjoining said photodetector.

6. The photodetector of claim 3 wherein an active device area is defined by forming a mesa through said through said Group IV semiconductor layer and said compound semiconductor layer.

7. The photodetector of claim 2 wherein said second semiconductor material is a Group IV semiconductor layer disposed on a substrate wafer, and said first semiconductor material is a compound semiconductor layer disposed on said Group IV semiconductor layer.

8. The photodetector of claim 7 wherein an active device area is defined by forming a mesa through said through said Group IV semiconductor layer and said compound semiconductor layer.

9. A photodetector comprising:

an absorption region made from a first semiconductor material, said absorption region configured to photogenerate charge carriers in response to incident light;

a multiplication region made from a second semiconductor material configured to receive at least a fraction of said photogenerated charge carriers, said multiplication region comprising a p-n junction to substantially multiply the number of charge carriers by avalanche multiplication, and contacts for applying a reverse bias voltage across said photodetector, wherein said semiconductor materials have lattice constants which differ from each other by more than 1% and the region of lowest doping of the p-n junction is adjacent to the absorption region, such that an electric field maximum for said applied reverse bias voltage is located in said multiplication region a substantial distance away from said absorption region, and as said reverse bias voltage increases electric fields in said photodetector increase and move toward said absorption region.

10. The photodetector of claim 9 wherein said second semiconductor material is an epitaxially-grown layer.

11. The photodetector of claim 9 wherein said second semiconductor material is a thinned semiconductor layer.

12. The photodetector of claim 9 wherein by dopant concentration and said thickness are selected so that at an operating reverse bias voltage said electric field in said absorption region has a value corresponding to about the maximum carrier velocities in said first semiconductor material, said value below electric field values which cause carrier tunneling in said first semiconductor material.

13. A photodetector comprising:

an $n^+$ type silicon substrate;

a $p^-$ type epitaxial silicon layer grown on said $n^+$ type silicon substrate;

a n-type InGaAs absorption layer bonded to said p– type epitaxial silicon layer;

a first contact formed on said $n^+$ type silicon substrate; and a second contact formed on said n-type InGaAs absorption layer, wherein in operation of said photodetector a reverse bias voltage is applied across said contacts causing an electric field maximum at about the interface between said $n^+$ type silicon substrate and said p– type epitaxial silicon layer.

14. The photodetector of claim 13 wherein said $n^+$ type silicon substrate comprises a substrate having a resistivity between about 10 to 30 Mohm-cm, wherein said n-type InGaAs absorption layer is about 1000 nm thick and has an unintentional doping level less than about $1 \times 10^{15}$ atoms/$cm^{-3}$, and wherein said p– type epitaxial silicon layer is about 1 um thick and has a doping level of about $3 \times 10^{16}$ atoms/$cm^{-3}$.

15. The photodetector of claim 13 wherein said first contact comprises an n implant layer.

16. The photodetector of claim 13 wherein said first contact comprises an $n^+$ implant layer.

* * * * *